United States Patent [19]

Dudeck et al.

[11] Patent Number: 4,521,769

[45] Date of Patent: Jun. 4, 1985

[54] DEVICE FOR DETECTING THE FAILURE OF A SENSOR

[75] Inventors: Ingo Dudeck, Weinstadt; Jürgen Schenk, Esslingen, both of Fed. Rep. of Germany

[73] Assignee: Daimler-Benz Aktiengesellschaft, Fed. Rep. of Germany

[21] Appl. No.: 471,658

[22] Filed: Mar. 3, 1983

[30] Foreign Application Priority Data

Mar. 30, 1982 [DE] Fed. Rep. of Germany ....... 3211644

[51] Int. Cl.[3] .............................................. G01L 23/22
[52] U.S. Cl. ..................................... 340/635; 73/1 R; 73/35; 123/479
[58] Field of Search ................... 73/35, 1 R; 123/425, 123/435, 479; 340/52 R, 540, 635, 653, 679

[56] References Cited

U.S. PATENT DOCUMENTS 4,320,729  3/1982  Sawada et al. ..................... 123/479
4,418,567  12/1983  Boning et al. ........................... 73/35

Primary Examiner—James J. Gill
Attorney, Agent, or Firm—Craig and Burns

[57] ABSTRACT

A device for detecting the failure of a sensor which is installed on machine elements which are fitted with rotating parts, a reference signal being obtained from the output signal of the sensor, the reference signal being compared, in a comparator, with the output signal of the sensor, the output pulses from the comparator being employed to trigger a retriggerable one-shot multivibrator circuit. The absence of the output signal initiates an alarm and/or an adjustment of certain machine sub-systems. The arrangement can be employed for monitoring the most diverse types of sensor, for example for monitoring knock sensors in internal combustion engines.

6 Claims, 2 Drawing Figures

DEVICE FOR DETECTING THE FAILURE OF A SENSOR

The invention relates to a device for detecting the failure of a sensor which is installed on machine elements which are fitted with rotating parts, in particular the failure of a knock sensor which is installed on an internal combustion engine, the output signal from this sensor being converted, in a reference circuit, to a rectified and smoothed reference signal which is compared, in a comparator, with a further quantity, a signal appearing at the output terminal of the comparator for as long as this further quantity exceeds the reference signal.

In many machines in which sensors are employed for regulating or controlling specific functions, the correct functioning of these sensors is of particular importance, since a failure of the sensor can lead to significant operational breakdowns or to the destruction of these machines. Thus, for example, the failure of a knock sensor which is installed on an internal combustion engine and the output signal of which is used for the automatic follow-up adjustment of the curve characterizing the ignition timing, to conform with variations in the knock limit, can lead to rapid destruction of the internal combustion engine.

A device for detecting the failure of a sensor which is installed on machine elements which are fitted with rotating parts, in particular the failure of a knock sensor which is installed on an internal combustion engine, the output signal from this sensor being converted, in a reference circuit, to a rectified and smoothed reference signal which is compared, in a comparator, with a further quantity, a signal appearing at the output terminal of the comparator for as long as this further quantity exceeds the reference signal, can be found in German Offenlegungsschrift No. 2,942,250, Offenlegungstag May 7, 1981. In such a device, tests are performed during test phases which lie between the combustion processes, to determine whether the amplitude of the knock threshold lies within defined limits. A device of this type is insufficiently sensitive to react quickly enough in the event of a slow failure of the sensor.

The invention provides a device which, in the event of a fault, is capable of reacting in a considerably more sensitive manner to a failure of the sensor, and which can emit an alarm signal as quickly as possible and/or adjust the machine which is to be monitored, to the effect that consequential damage cannot occur.

This is achieved, according to the invention, by the features which are characterized in that a quantity, designated as a further quantity, is the output signal ($U_s$) from the sensor, in that a reference signal ($U_R$) is diminished or amplified to the extent that it is continually exceeded by the peak values, appearing at regular intervals of time, of the normal output signal from the sensor, in that a one-shot multivibrator is provided, which can be retriggered by the output signal from a comparator, which has a delay time (T) exceeding the period of the output signal ($U_s$) from the sensor, and after which a control device and/or an alarm device is series-connected, emitting a control signal and/or an alarm signal if the output signal ($U_{MF}$) from the one-shot multivibrator vanishes.

According to the invention, a rectified and smoothed reference signal is formed from the sensor output signal, this signal exhibiting a curve shape which is a function of the load on the rotating machine parts and of the speed at which they are rotating, and in the case of internal combustion engines is, for example, a function of the variation of the compression pressure in a cylinder, of the structure-borne noise or of the ignition voltage, and this reference signal is diminished to the extent that, in each period, it is exceeded at least once by the peak value of the sensor output signal. The term "period" is to be understood, both here and in the text which follows, as the mean time interval between the peak values of the sensor output signal at the rotation speed (m) at the time in question. These exceeding peak value events are detected in a comparator, the output signal from which is used for triggering a retriggerable one-shot multivibrator, so that when the sensor is functioning correctly, the multivibrator is always triggered and emits a continuous signal. If the sensor fails, the triggering pulses are also absent and, after expiry of the flip-flop delay, the multivibrator ceases to generate to an output signal. The zero signal at the output terminal of the multivibrator is regarded as a failure signal and is used for emitting an alarm and/or an adjustment of the machine which is to be monitored.

Enhanced reliability with regard to faulty operation can be obtained if a speed-dependent signal is added to the reference signal, since this procedure permits not only the total failure to be detected, but also permits the detection of a marked reduction in the sensitivity of the sensor, which usually precedes a total failure.

Greater reliability with regard to faulty operation and more rapid detection of a failure can likewise be achieved if the delay time of the one-shot multivibrator which, if constant, must be longer than the time period at the slowest rotation speed, can likewise be varied as a function of the speed of the rotating machine part, so that it is, at all times, only somewhat longer than the time period at the speed prevailing the moment in question, or of the function which is derived from this speed.

It is an object of the invention to provide an improved device for detecting failure of a sensor, the sensor being for installation on a rotating machine element.

It is another object of the invention to provide a device which, in the event of a default, is capable of reacting in a considerably more sensitive manner to a failure of a sensor, and which can emit an alarm signal as quickly as possible and/or adjust a machine which is to be monitored, to the effect that consequential damage cannot occur.

It is another object of the invention to provide a device for detecting the failure of a sensor which is installed on machine elements fitted with rotating parts wherein a quantity, designated as a further quantity, is the output signal from the sensor, in that a reference signal is diminished or amplified to the extent that it is continually exceeded by the peak values appearing at regular intervals of time of the normal output signal from the sensor, and in that a one-shot multivibrator is provided which can be retriggered by the output signal from a comparator which has a delay time exceeding the period of the output signal from the sensor, and after which a control device and/or an alarm device is series connected, emitting a control signal and/or an alarm signal if the output signal from the one-shot multivibrator vanishes.

These and other objects, features, and advantages of the present invention will become more apparent from the following description when taken in connection with the accompanying drawings which show, for the purposes of illustration only, one embodiment in accordance with the present invention, and wherein.

Figure 1:
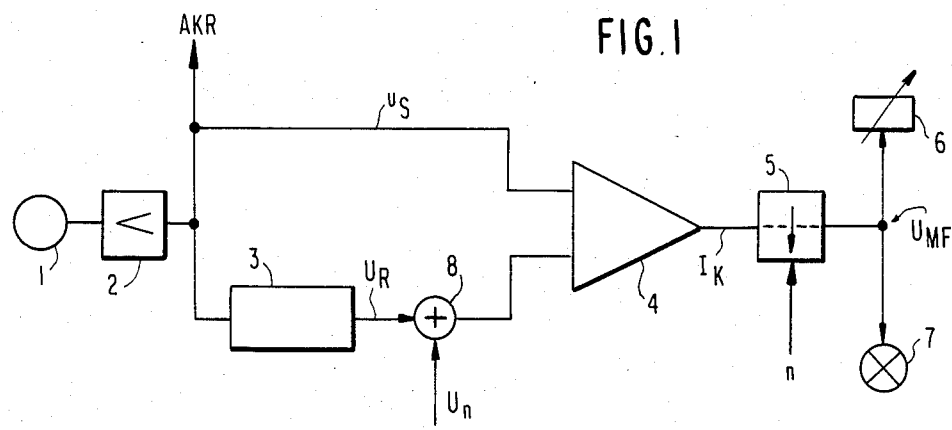
FIG. 1 shows a schematic circuit diagram of the device.

Referring now to the drawing, wherein like reference numerals are used throughout the various views to designate like parts, in FIG. 1, the knock sensor 1 which is to be monitored is diagrammatically represented as a circuit, this sensor forming part of a so-called anti-knock control system, AKR, for an internal combustion engine. It can, for example, be a piezoelectric acceleration sensor of the type employed in control systems of this nature. Its output signal exhibits an alternating form which varies, in a periodic manner, between large-amplitude pulses and small-amplitude pulses, as a result of the fact that the machine parts are rotating or as a result of the functions which are derived from these parts (in the case of internal combustion engines, the time-dependent variation of either the combustion pressure or the ignition voltage). After any amplification and filtering which may be necessary, performed in a circuit which is diagrammatically indicated as Box 2, this signal reaches, as the sensor output signal $U_s$, the anti-knock control system (AKR) which is not represented in the Figure, but is indicated by an arrow.

This sensor output signal $U_s$ is supplied to a reference circuit 3, in which a rectified and smoothed reference signal $U_R$ is derived from it, and is diminished or amplified to the extent that it is continually exceeded by the peak values, appearing at regular time intervals, of the normal, that is to say undisturbed, output signal $U_s$ from the sensor. A rotation speed signal $U_n$ which is a function of the speed at which the machine part is rotating is added, in the form of a direct-current voltage, to the reference signal $U_R$ appearing at the output terminal of the reference circuit 3, this additional operation being performed in an analog adding circuit 8. The sum signal $U_R+U_n$ is supplied to one of the input terminals of a comparator 4, the sensor output signal $U_s$ being applied to its other input terminal. The comparator emits an output pulse $I_K$ when the sensor output signal $U_s$ rises above the sum signal $U_R+U_n$. These output pulses $I_K$ are employed to trigger a retriggerable one-shot multivibrator 5, the duration of the output pulses from this multivibrator likewise being variable, as a function of the speed at which the machine part is rotating, and amounting, for example, to 1.5 times the period of the sensor output signal $U_s$. By this means, it is ensured that each of the $I_K$ pulses, which occur at least once per period, triggers the one-shot multivibrator, provided that its output pulse, triggered by the previous triggering pulse, is still present. As a result, if the sensor 1 is intact, a constant digital output signal $U_{MF}$ is produced, which is employed for triggering an alarm device 7 and a control device 6, for example for adjusting the ignition timing. The alarm is triggered whenever the output signal $U_{MF}$ disappears.

Figure 2:
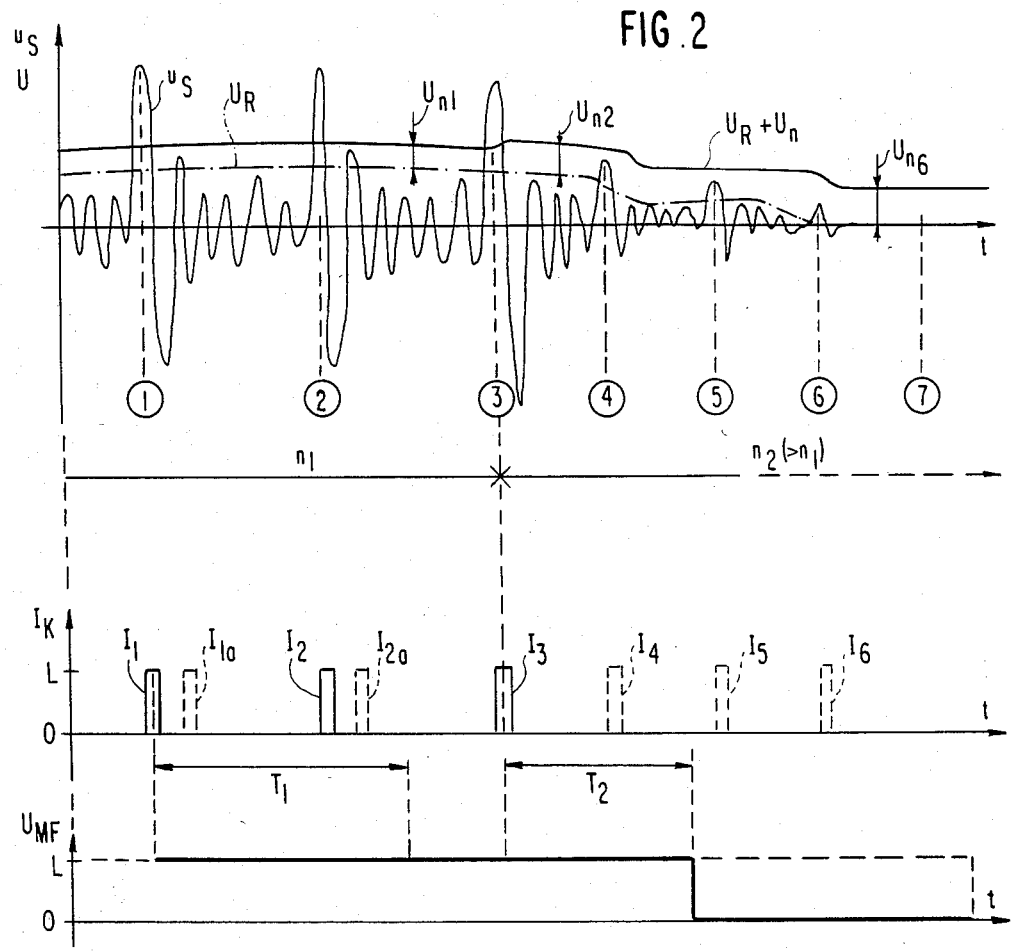
FIG. 2 shows the variation, as a function of time, of the individual signals.

The time-dependent variation of the individual signals is shown, in FIG. 2, over a given time period. The sensor output signal $U_s$ is represented as an alternating-voltage signal with varying amplitudes, from which it is easy to recognize the "periodic variation" of the signal. The beginnings of the successive periods are respectively marked by the circled numbers 1 to 7. The periods 1 and 2 are assigned to a defined rotation speed $n_1$, while the following shorter periods are assigned to a rotation speed $n_2$ which is higher by a factor of approximately 1.5. In the periods 1 to 3 the signal from sensor 1 can be said to be "normal", while in the periods 4 and 5 they are reduced, due to reduced sensitivity of the sensor 1, as a sign that a failure is beginning and, from period 6 onwards, they are no longer present, due to the fact that the sensor 1 has failed.

The reference signal $U_R$, represented by a dash-dotted line, is formed from the sensor output signal $U_s$, for example by peak value rectification, and is diminished to the extent that it is exceeded by at least one or two peaks of the output signal $U_s$ of sensor 1. If this is the case, the comparator 4 emits output pulses $I_K$, which are represented in a second lower diagram drawn on a matching time-scale. In the case of all the output pulses $I_1$ to $I_6$, drawn with continuous lines and broken lines, the index figures being assigned to the correspondingly numbered period, the sensor output signal $U_s$ exceeds the reference signal $U_R$. This also holds for the periods 4 and 5, during which the reference signal $U_R$ is, together with the sensor output signal $U_s$, also reduced. If, therefore, the reference signal $U_R$ is used as a threshold value, reduced sensor sensitivity is not detected as a fault. For this reason, a direct-current voltage which is a function of the rotation speed is added, as a speed signal $U_n$, to the reference signal $U_R$. In the upper diagram of FIG. 2, the result $U_R+U_n$, is represented as a continuous line, the value $U_{n1}$ being assigned to the rotation speed $n_1$ and the value $U_{n2}$ being assigned to the rotation speed $n_2$. As a result, on the one hand, the duplicated pulses $I_{1a}$ and $I_{2a}$ are discarded, since they do not rise above the new threshold value $U_R+U_n$ indicated by the continuous line. For the same reason, the pulses $I_4$ and $I_5$ are also discarded. $I_6$ is discarded because even very small peaks in the sensor output signal $U_s$ which still rise above the reference signal $U_R$, which is tending to zero, now no longer reach the value $U_{n6}$.

The difference can clearly be seen in the output signal $U_{MF}$ from the one-shot multivibrator, this signal being plotted, against time, in the third diagram. The delay time T of the one-shot multivibrator, which is a function of the rotation speed, a duration of 1.5 times the period corresponding to the current rotation speed having been mentioned as an example, is marked $T_1$ for the speed $n_1$ and $T_2$ for the speed $n_2$, and, triggered by the pulses $I_1$ and $I_3$ respectively, is plotted in each case as an arrow in the direction of the time axis.

In the case in which the reference signal $U_R$ serves as the threshold value, the output signal $U_{MF}$ does not terminate until the delay time of the one-shot multivibrator, triggered by the pulse $I_6$, has expired, in the seventh period, the reduction in the sensitivity of the sensor 1, occurring as a result of its becoming faulty, having been undetected, since only its complete failure is detected. This signal is represented by a broken line.

In the other case, in which the rotation speed signal $U_n$ was added to the reference signal, the pulse $I_3$, at the output terminal of the comparator 4, is the last before the sensitivity of the sensor 1 decreases to an extent such that the threshold value $U_R+U_n$ can no longer be exceeded. The output signal $U_{MF}$, represented by the continuous line, terminates as soon as the delay time $T_2$, triggered by $I_3$, expires, in the fourth period, so that, in this case, it is possible to initiate the alarm and/or the adjustment three periods earlier.

The failure detection device which has been described can be used in conjunction with all sensors which emit a "periodic signal" and is not, therefore, restricted to known sensors for internal combustion engines.

While we have shown and described only one embodiment in accordance with the present invention, it is understood that the same is not limited thereto but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A device for detecting the failure of a sensor which is installed on machine elements which are fitted with rotating parts, in particular the failure of a knock sensor which is installed on an internal combustion engine, the output signal ($U_s$) from the sensor being converted, in a reference circuit, to a rectified and smoothed reference signal ($U_R$) which is compared, in a comparator, with a further quantity, a signal appearing at the output terminal of the comparator for as long as this further quantity exceeds the reference signal ($U_R$), characterized in that the further quantity is the output signal ($U_s$) from the sensor, in that the reference signal ($U_R$) is one of diminished and amplified to the extent that it is continually exceeded by the peak values, appearing at regular intervals of time, of the normal output signal from the sensor, in that a one-shot multivibrator is provided, which can be retriggered by an output signal ($I_K$) from the comparator, which has a delay time (T) exceeding the period of the output signal ($U_s$) from the sensor, and after which one of a control device and an alarm device series-connected with the one-shot multivibrator, emits respectively one of a control signal and an alarm signal if the output signal ($U_{MF}$) from the one-shot multivibrator vanishes.

2. Device according to claim 1, further comprising an adding circuit means for adding a speed signal ($U_n$) to the reference signal ($U_R$), the speed signal ($U_n$) being a function of the rotation speed of the rotating machines to provide a sum signal input to the comparator element.

3. Device according to claim 1, further comprising means for controlling the one-shot multivibrator to vary the duration (T) of the output pulse from the one-shot multivibrator as a function of the rotation speed (n) of the rotating machine element.

4. A device for detecting failure of a sensor, the sensor being for installation on a rotating machine element,
means for smoothing and rectifying a sensor output signal having a first time period,
means for comparing the sensor output signal with the smoothed and rectified signal to produce a comparator output signal when the sensor output signal exceeds the smoothed and rectified signal,
one-shot multivibrator means receiving the comparator output for producing an output pulse having a second time period exceeding the first time period, and
means generating an output signal when the output pulse vanishes in response to failure of the sensor for actuating at least one of a control device and an alarm device.

5. A device according to claim 4, further comprising means adding a signal representing a frequency of rotation of the rotating machine element to the smoothed and rectified sensor output signal for producing a sum signal as input to the means for comparing.

6. A device according to claim 4, further comprising means for controlling the one-shot multivibrator to vary the duration of the output pulse as a function of the frequency of rotation of the rotating machine element.

* * * * *